(12) United States Patent
Carpenter et al.

(10) Patent No.: US 6,275,958 B1
(45) Date of Patent: Aug. 14, 2001

(54) FAULT DETECTION IN A REDUNDANT POWER CONVERTER

(75) Inventors: Brian A. Carpenter, Cary, NC (US); Girish C. Johari, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/181,498

(22) Filed: Oct. 28, 1998

(51) Int. Cl.[7] .............................. G06F 1/28; H02H 7/10; H02J 3/38
(52) U.S. Cl. .............................. 714/48; 713/300; 307/82; 363/71
(58) Field of Search .................... 714/48, 14; 713/300; 307/64, 86, 112, 113, 116, 125, 130, 131, 43, 58, 45, 82; 323/282, 285; 361/79, 87; 363/65, 123; 340/657, 660, 664; 324/111, 142, 525; 702/57–60, 64, 65

(56) References Cited

U.S. PATENT DOCUMENTS

| | | |
|---|---|---|
| 4,801,859 | 1/1989 | Dishner . |
| 5,138,249 | 8/1992 | Capel . |
| 5,359,280 | 10/1994 | Canter et al. . |
| 5,397,976 | 3/1995 | Madden et al. . |
| 5,598,041 | 1/1997 | Willis . |
| 5,617,012 | * 4/1997 | Murakami . |
| 5,751,140 | 5/1998 | Canter . |
| 5,786,641 | 7/1998 | Nakanishi et al. . |
| 5,808,902 | 9/1998 | Levert et al. . |
| 5,839,093 | 11/1998 | Novosel et al. . |
| 5,894,413 | * 4/1999 | Ferguson . |
| 5,894,415 | * 4/1999 | Habegger . |

* cited by examiner

Primary Examiner—Gopal C. Ray
(74) Attorney, Agent, or Firm—Sawyer Law Group, P.A.

(57) ABSTRACT

Aspects for sensing faults in a redundant power converter are described. An exemplary circuit aspect includes a signal transition monitor for monitoring signal transitions at a predetermined node within the redundant power converter, and a detector for detecting a fault condition in the redundant power converter when a proper signal transition fails to occur during a base period of switching. The aspects sense faults in a manner which allows replacement during a scheduled downtime, so that redundancy is restorable without having an unscheduled outage.

20 Claims, 5 Drawing Sheets

Sub Optimal

Optimal

FAULT DETECTION IN A REDUNDANT POWER CONVERTER

RELATED APPLICATIONS

The present invention is related to co-pending U.S. patent applications, entitled FAULT ISOLATION IN A REDUNDANT POWER CONVERTER, Ser. No. 09/181,124, and FAULT REPORTING IN A REDUNDANT POWER CONVERTER, Ser. No. 09/181,463, filed on even date herewith, and assigned to the assignee of the present invention.

FIELD OF THE INVENTION

The present invention relates to redundant power converters, and more particularly, to detecting a fault condition in a redundant power converter.

BACKGROUND OF THE INVENTION

Voltage regulator devices typically maintain terminal voltages of voltage sources within required limits despite variations in input voltages or loads. Industry standard voltage regulators, also known as DC/DC converters, are generally not fault tolerant, thus the output of the regulator goes out of regulation during a fault. Most of the point-of-load power converters in server systems, like the voltage regulator modules (VRMs) for Intel processors, are of the same topology: non-isolated, step-down (buck) converters with synchronous rectification. A basic schematic diagram of a standard buck converter is illustrated in FIG. 1. The distinguishing feature of a synchronous buck converter is that a lower switch S2 is implemented by a diode 10 in parallel with a field effect transistor (FET) 12. In some designs, the body diode of the MOSFET is used for the function of a discrete diode 10. In this case an open circuit, say due to a wire bond failure would also be detected. Switch S2 and another switch S1, formed by a FET 14, are controlled in a complimentary fashion, such that either one or the other switch, but not both switches, is ON, except for a small 'dead-time' when only the diode 10 conducts. Efficiency is achieved by the arrangement, because the losses of existing FET devices are generally better than those of existing diode devices. The arrangement further allows current to flow through S2 in reverse, and thus synchronous converters can regulate down to zero DC load.

Many converters, such as that in FIG. 1, also use a control scheme called 'current-mode' control, where output current is sensed through a resistor 16 (R1), which is normally in the range of 3 to 10 milliohms. The resulting information is then used to help control the converter and the output voltage feedback via control unit 18. A clock signal, CLOCK, in the control unit 18 sets the switching frequency and is the basis of timing inside the converter. The base period of the switching, Tclock, results from the clock signal. A switching node, V1, acts as a summing point of switches S1, S2, and inductor L1. Under normal operations, the voltage at V1 has a rising edge synchronized, except for propagation delays, with the clock signal and a falling edge set by the control unit 18. Excluding losses, during DC conditions, the period that the signal at V1 is on, Ton,=Tclock (Vout/Vin). The rectangular waveform resulting at V1 is then chopped down by a filter formed by the inductor 19 (L1) and a capacitor 21 (C1). In order to keep the output voltage ripple at low levels required by a load device, e.g., a CPU (central processing unit), the corner frequency of the L1-C1 filter is virtually always kept at least 10 times lower in frequency than the frequency of the clock signal.

Faults in a voltage regulator can be problematic and are usually not detected until the regulator goes out of tolerance as detected by a fault detection device coupled to the output of the regulator. "Up-time" is becoming increasingly important in servers as the servers take on tasks once performed by ultra-reliable mainframes. Redundancy is the typical method used to achieve a high degree of basic reliability in servers. FIG. 2 illustrates a plurality of redundant voltage regulator modules 20, VRM1 to VRMn, which are coupled in parallel to a sensitive load device 22, e.g., a CPU, such that if one VRM 20 goes down, another VRM takes over. Without fault detection hooks to sense failures in redundant elements and a way in which to report them, however, redundancy is significantly less useful.

Isolating faults is also problematic. Prior art approaches typically use a diode on the output of the converter in order to provide a means to isolate parallel converters for fault tolerance reasons. Due to their finite voltage drop, "OR-ing" diodes to isolate a faulted converter significantly decreases the efficiency of the system. Further, the diodes make it nearly impossible to meet stringent dynamic load performance requirements of certain specifications, e.g., Intel specifications. Simply tieing the converters together offers one possible alternative approach, but the overall reliability actually decreases under such circumstances, since many faults in one converter may cause either an overcurrent or overvoltage condition, which brings down the entire system of parallel converters. While replacing the diode on the output with a semiconductor switch, such as a power MOSFET, has been attempted, the problems of the OR-ing of the diodes remain, albeit in a somewhat diminished capacity.

Accordingly, what is needed is a method and system for detecting faults in a redundant power converter, e.g., voltage regulator module, before the output voltage goes out of regulation.

SUMMARY OF THE INVENTION

The present invention provides aspects for sensing faults in a redundant power converter. An exemplary circuit aspect includes a signal transition monitor for monitoring signal transitions at a predetermined node within the redundant power converter, and a detector for detecting a fault condition in the redundant power converter when a proper signal transition fails to occur during a base period of switching.

Through the present invention, faults are capably sensed in a manner that allows a faulted converter to be replaced during a scheduled period of down time to thus achieve restoration without having an unscheduled outage. These and other advantages of the aspects of the present invention will be more fully understood in conjunction with the following detailed description and accompanying drawings.

DETAILED DESCRIPTION OF THE INVENTION

The present invention relates to detecting fault conditions in a redundant power converter. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be merely limited to the embodiment shown but is to be accorded the widest scope consistent with the principles and features described herein. It should be further appreciated that the aspects of the present invention are described with reference to voltage regulators for illustrative purposes. The principles apply to any synchronous converter and, with suitable modification, to any switching converter that requires fault detection to support redundancy, since all converters have timing sources and a switching node.

Fault Detection

Figure 1:
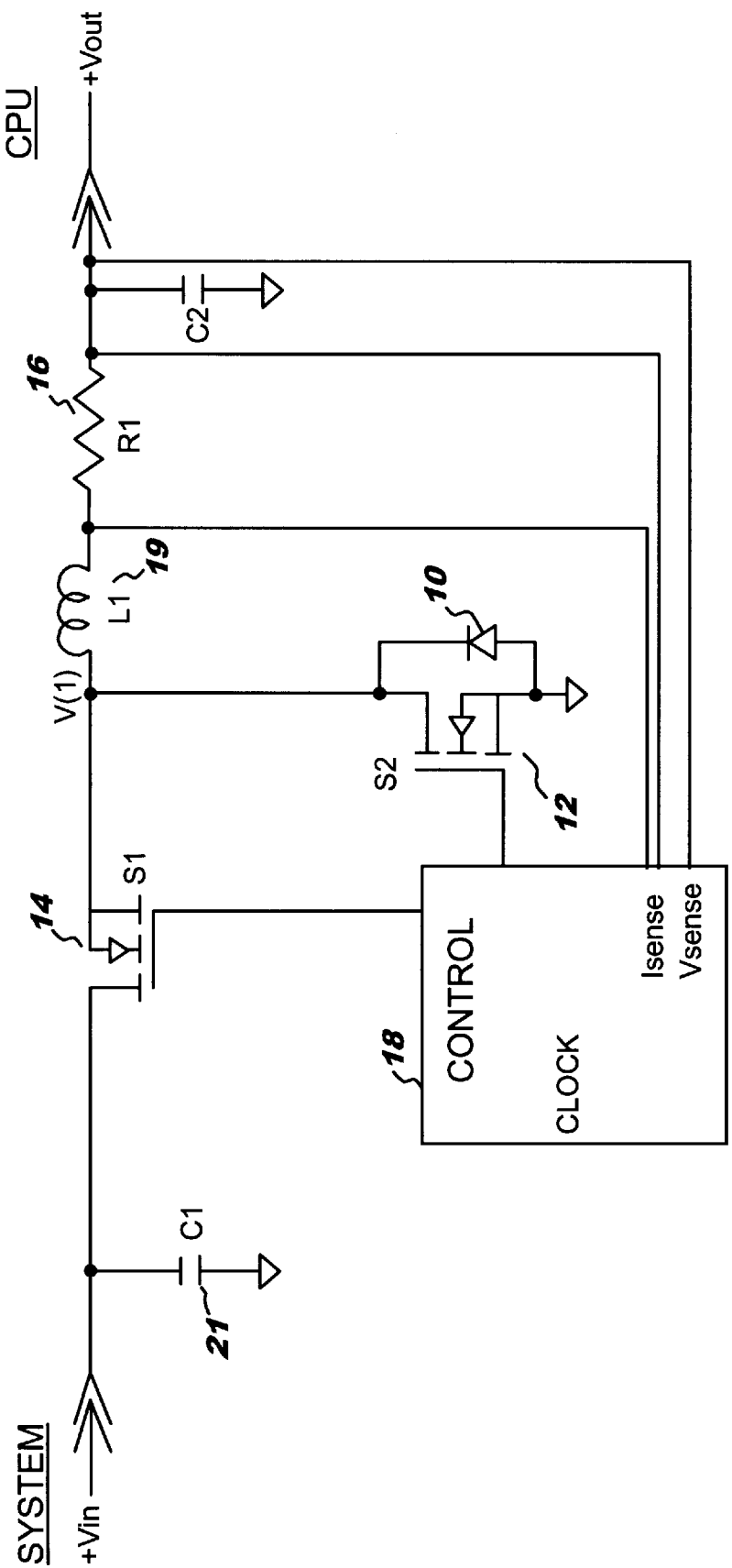
FIG. 1 illustrates a prior art diagram of a voltage regulator.
Figure 2:
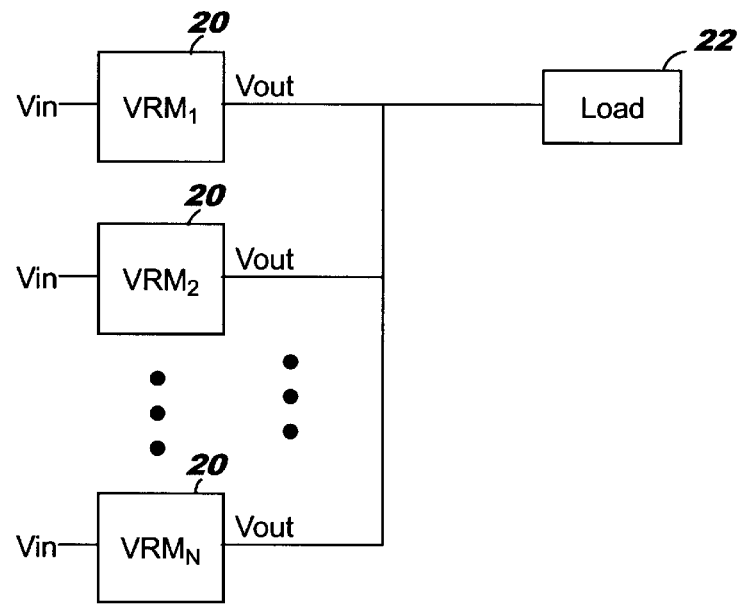
FIG. 2 illustrates a prior art arrangement of redundant voltage regulators.

A number of conditions may arise in a voltage regulator that result in a fault. As mentioned previously, typical regulators are limited because their fault detection circuitry only identifies conditions which result in out of tolerance conditions. Except for faults in the input or output capacitors of buck converters, (e.g., C1 or C2 in FIG. 1), diagnosis of substantially all faults within a converter is capably achieved by way of the clock signal and V1 signal before the output voltage goes out of regulation in accordance with one aspect of the present invention. Referring to the regulator of FIG. 1, fault conditions include S1 shorted or open, S2 shorted, control unit 18 drive failure in S1 (i.e., drive HIGH or drive LOW), and control unit 18 drive failure in S2 (i.e., drive HIGH only, LOW drive is not detected because of the presence of the diode 10, in which case the converter continues to operate but with reduced efficiency). In order to capably diagnose such fault conditions before the voltage goes out of regulation, fault detection/protection is provided as illustrated by the circuit diagram in FIG. 3 with an associated timing diagram illustrated in FIG. 4.

Figure 3:
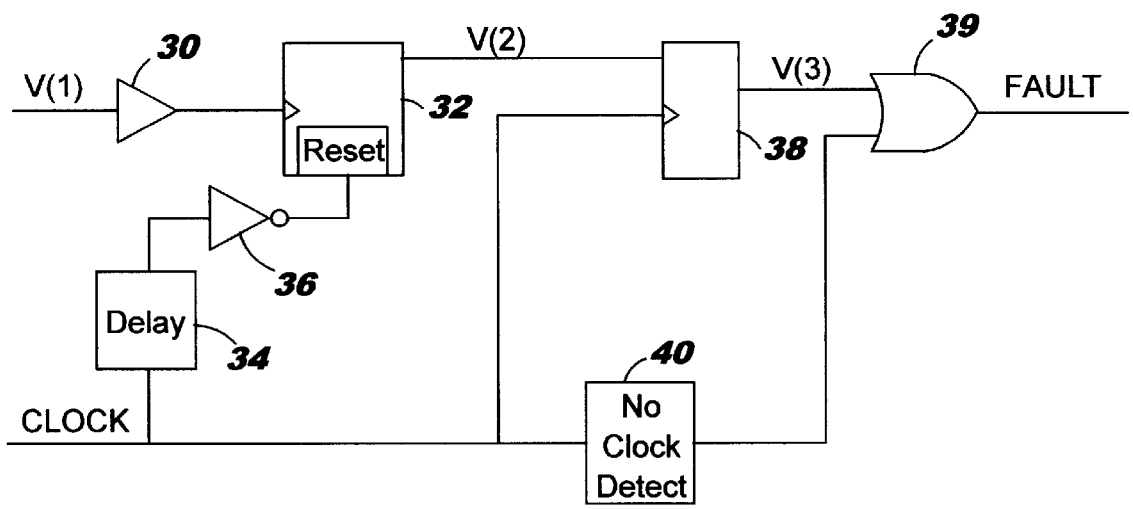
FIG. 3 illustrates a fault detection and protection circuit in accordance with one aspect of the present invention.

As shown in FIG. 3, the signal from the summing node V1 is input to a receiver 30, which scales the magnitude of the signal V1 for the downstream digital logic of the circuit. The signal from V1 scaled through receiver 30 is input to a negative-edge triggered flip-flip 32, e.g., a toggle (T) flip-flop. A clock signal, CLOCK, from the control unit 18 (FIG. 1) is delayed through a standard delay device 34, as desired, and inverted through inverter 36 for use as the input to reset the flip-flop 32. Under non-fault conditions, a rectangular pulse is generated from flip-flop 32 as signal V2, which is HIGH at the rising edge of the clock signal. The signal V2 is then input into a positive-edge triggered flip-flop 38, e.g., a data (D) flip-flop, which is clocked by the clock signal.

Figure 4:
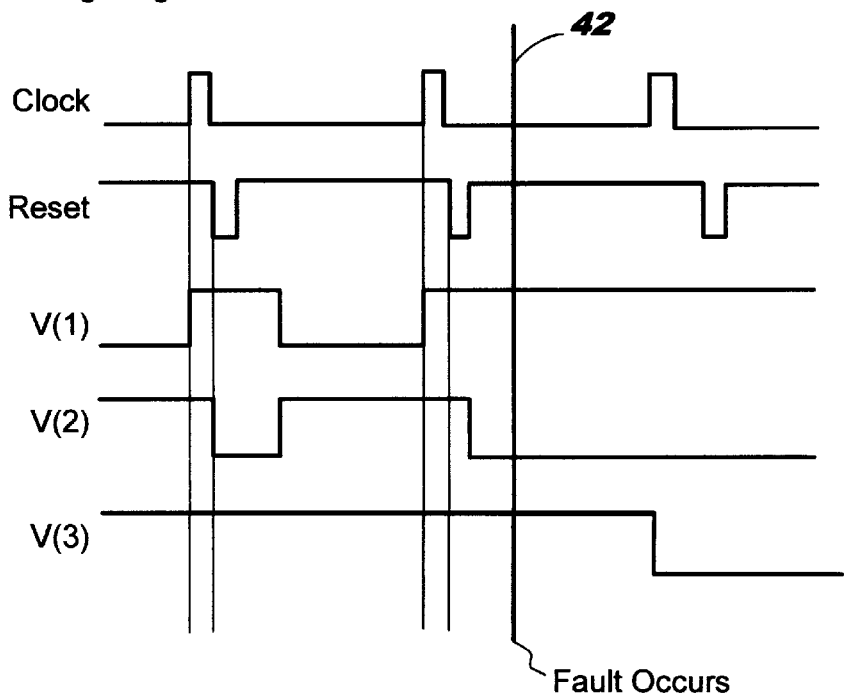
FIG. 4 illustrates a timing diagram associated with the circuit of FIG. 3.

Since a fault condition exists when there is not both a positive transition and a negative transition of V1 in the period of the clock signal, Tclock, a fault occurs and is indicated when the signal V2 remains LOW. Referring to FIG. 4, the lack of a negative transition in V1 is seen at point 42, thus indicating the existence of a fault condition at the time of point 42. The fault indication also appears as a LOW on signal line V3, which is the signal output from the flip-flop 38. To account for a possible no-clock condition, suitably the signal V3 is logically OR-ed through an OR gate logic device 39 with a no-clock detection signal from a standard no-clock detection circuit 40. Thus, when V3 is LOW and the no clock detect is LOW (indicating that there is not a no-clock condition), the fault detection circuit's output signal, FAULT, is HIGH, indicating the presence of a fault condition. While a fault condition of at least one clock period can be accommodated because, in redundant mode, the output current is half of a full load, and the LC filter, with a time constant greater than ten times Tclock (a base period of switching), buffers the output, the detection of a fault condition in accordance with the present invention successfully occurs without waiting for the voltage to go out of regulation. The base period of switching can be fixed or variable based upon control methods and clocking schemes (i.e. constant on-time control, constant off-time control or frequency modulation techniques).

Fault Isolation

Figure 5:
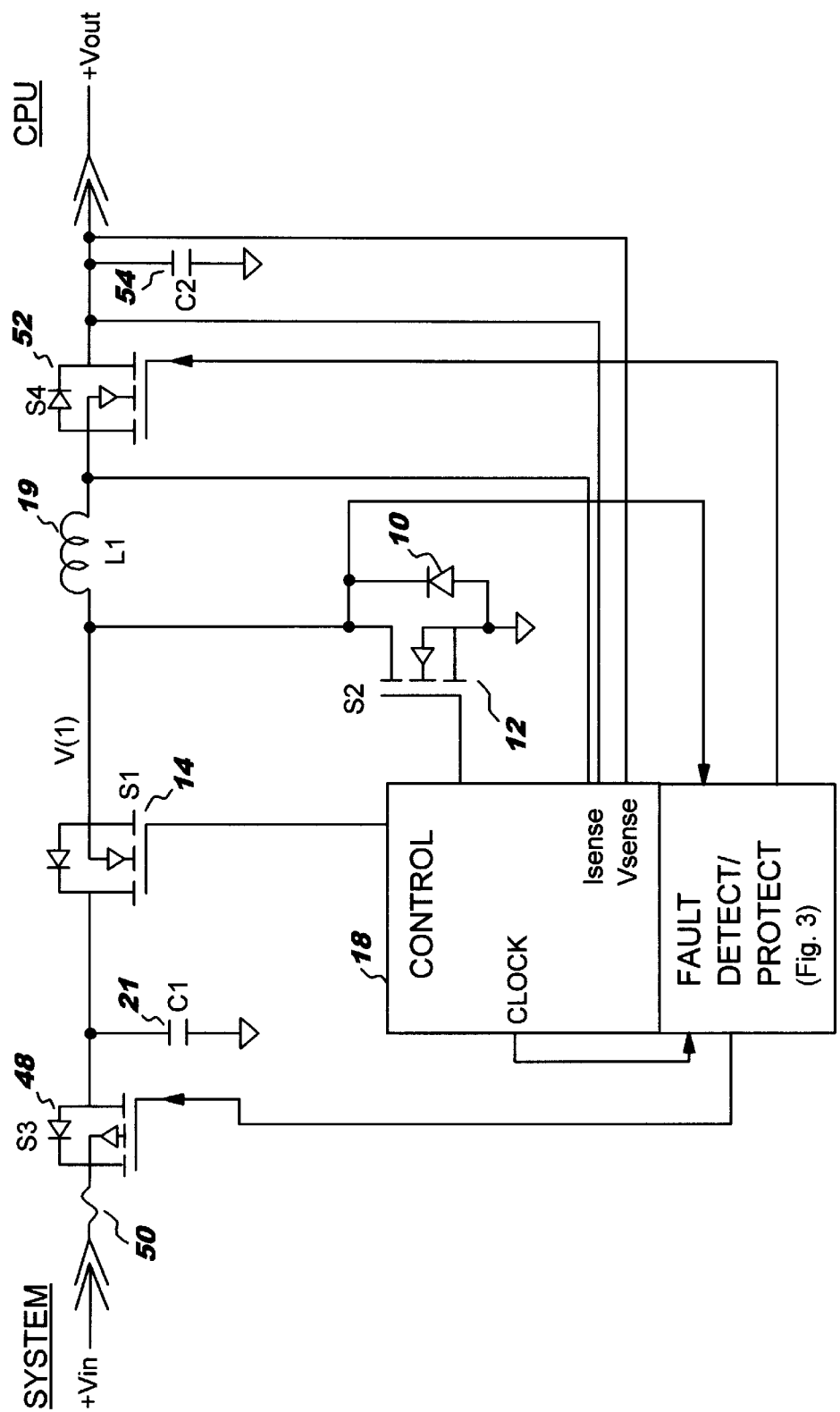
FIG. 5 illustrates a voltage regulator with isolation mechanisms in accordance with one aspect of the present invention.

Once detected, preferably isolation of a regulator having a fault condition is achieved in accordance with a further aspect of the present invention. Potentially, either switch S1 or S2 may short. When S1 shorts, eventually Vin appears at Vout, while when S2 shorts, eventually a ground potential of 0 V appears at Vout. Since one switch cannot successfully isolate both S1 and S2, separate mechanisms are utilized to isolate the input and the output of the regulator. FIG. 5 illustrates a voltage regulator with preferred isolation mechanisms. As shown, the voltage regulator of FIG. 5 includes fault detection/protection circuitry in the control unit 18 that represents the fault detection circuit described above with reference to FIG. 3. In accordance with the present invention, an inline switch 48 (S3), e.g., a MOSFET, is utilized on the load side of a failsafe fuse 50 as the input disconnection mechanism, while a switch 52 (S4), e.g., a MOSFET (metal oxide semiconductor FET), acts as the output disconnection mechanism. In operation, the switch 48 opens to provide isolation of the input when S1 is sensed as being shorted, while switch 52 opens to provide isolation of the output when S2 is sensed as being shorted.

When using MOSFETs as the protection switch, two switches are required, and care must be taken with respect to the body diode inherent in the MOSFET structure. In FIG. 5, the output protection switch (52) must be positioned with the diode as shown, so that if diode 10 or transistor 12 becomes a short circuit, then switch 52 would prevent the short circuit from sinking current from the shared bus, which it would not were the diode facing the other way. Since the preferred arrangement would not block an overvoltage resulting from a short of switch 48, the input protection FET must have its diode as shown. This situation, by implication, means that a single FET implementation cannot provide full protection to the user.

With the arrangement of FIG. 5, cases where input protection is triggered are nondestructive. Thus, under suitable logic control, a number of retries may be used before logically latching the converter off. Further, the sensitive means of the fault detection circuit are enabled. Additionally, the MOSFET 52 can be controlled in a linear fashion during plug-in to provide inrush current limiting for a converter with hot-plug requirements. Also, the typical resistor (e.g., R1, FIG. 1) for sensing current is eliminated from current-mode controlled converters by the use of switch 52. Overall efficiency is therefore improved, with dissipation decreased approximately 2 watts (W) in a 20 ampere (A) converter. Since a switch resistance no longer appears between the load and the output capacitor 54 (C2), dynamic performance is improved, and fewer capacitors are necessary for a given level of dynamic performance.

It is recognized that the position of switch 52 does not isolate the output capacitance 54 from the rest of the circuitry, so that a short circuit of capacitance 54 could bring down the system. However, such a situation is considered statistically unlikely to occur, since the number of capacitors has been reduced as compared to the prior art. Further, the power dissipation of the regulator is lower so that the remaining capacitors run at a lower temperature. Additionally, stresses on the output capacitor 54 are minimal, since output capacitance ripple current is 1 to 10% of rated value, and output voltages for this type of converter are usually quite low, e.g., in the range of 1.0V to 2.5V (volts), well below the ratings of 6.3V or even 4V capacitors. Also, the current and power levels available in redundant arrangements typically quickly open the output capacitor in the unlikely event of a fault.

Fault Reporting

Figure 6:
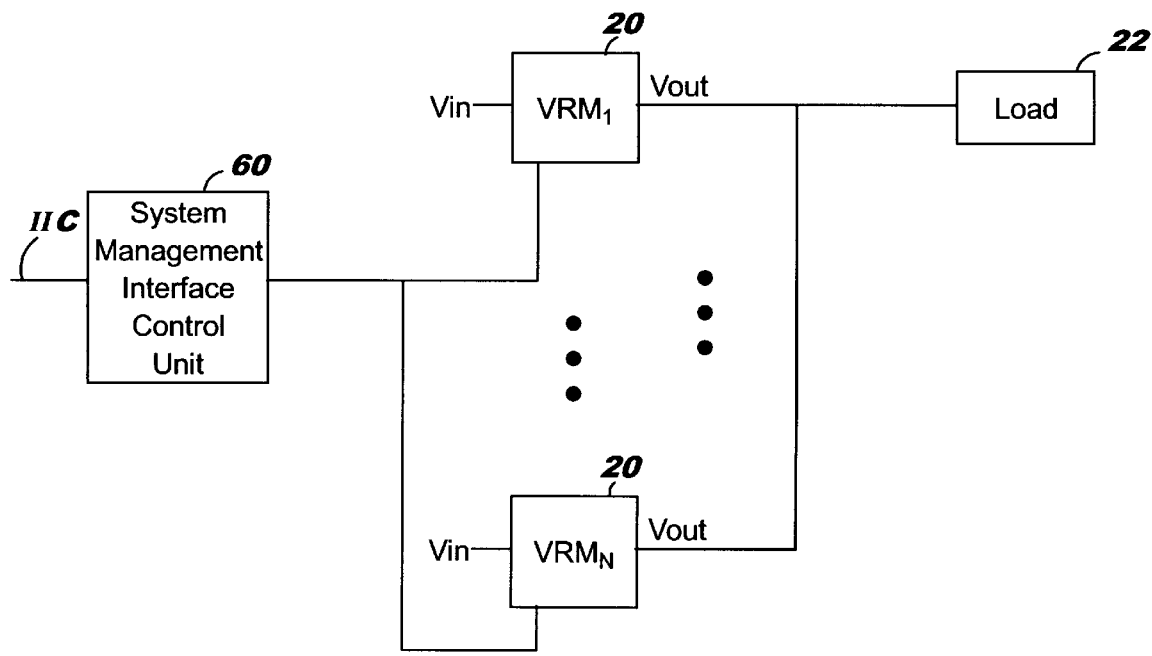
FIG. 6 illustrates a parallel arrangement of redundant voltage regulators including management control for fault reporting in accordance with one aspect of the present invention.
Figure 7A:
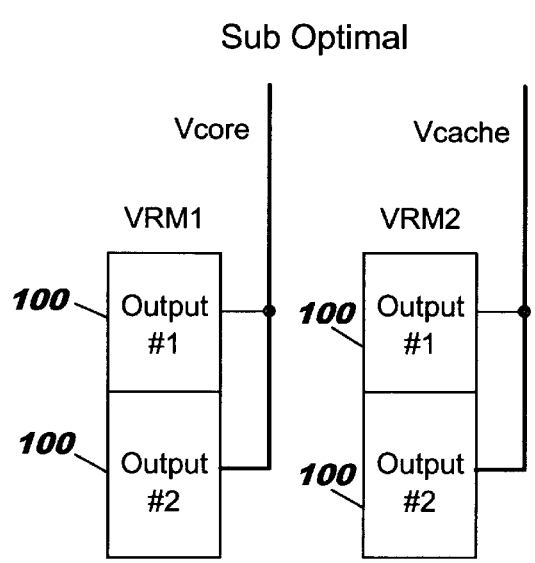
FIG. 7a is a first arrangement of redundant voltage regulators in accordance with the present invention.
Figure 7B:
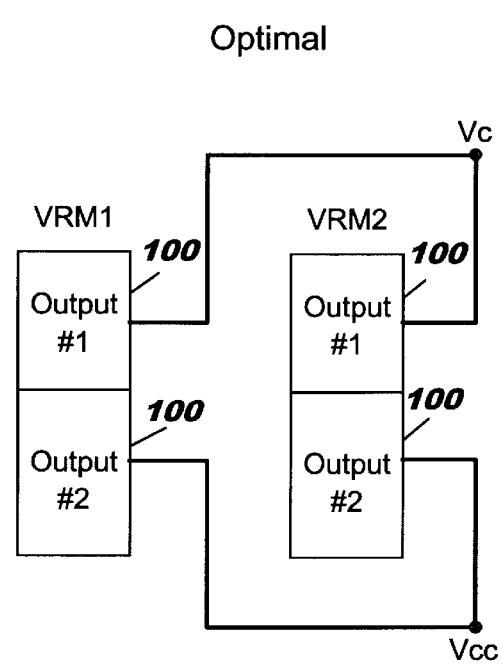
FIG. 7b is a second optional arrangement of redundant voltage regulators in accordance with the present invention.

In addition to isolation of faults detected, reporting of detected faults is also desirable. As shown in FIG. 6, a system management interface control unit 60, e.g., a microcontroller, monitors the fault detection circuitry via suitable programming on an appropriate computer readable medium to access data on the condition of redundant converters on a given card, as well as source information. One of the features of a preferred embodiment of the present invention is to provide two converters on the same physical card. Whereas the typical first impulse is to connect the two outputs of the two converters 100 of the same card together as shown is FIG. 7a, in reality it is better to cross-connect them as shown in FIG. 7b. This allows you to hot-plug replace a failed card without bringing the system down. The data on the condition of the converters being monitored includes, for example, individual fault bits for each half of two redundant converters on a card, paralleling check, thermal fault bits, and pending failure. Source information being monitored by system management interface control unit 60 includes, for example, information on a manufacturer, data code, revision level, firmware level, part number, and input and output voltage and current of the regulator. The information may be accessed via an industry standard inter-integrated circuit, IIC, bus EEPROM (electrically erasable programmable read only memory), as is well understood by those skilled in the art. The system management interface control unit 60 may also be configured to perform the functions of the control unit and fault detection directly for the VRMs, if desired.

Pending or predictive failure analysis is also readily implemented with the system management interface control unit 60. Through the programming of the system management interface control unit 60, monitoring of key nodes within the converters results, so that tracking of the values on the nodes over time is achieved. Prediction may then be performed when the converter is expected to exceed its specification based on trend analysis of the data gathered by the system management interface control unit 60. Predictive analysis further functions well for long term thermal drift conditions and wearout of mechanisms in the converter components.

Unlike current interfaces, which are indirect via discrete components and bus expanders, the utilization of the system management interface control unit achieves more standard and ready access to the converters. With the IIC addresses hardwired to the converter socket, a total of eight dual converters may be addressed, which provides eight redundant power outputs or sixteen non-redundant power outputs.

By way of example, support is thus achieved for four Intel Slot 2 processors or eight Intel Slot 1 processors, redundantly, or double the number without redundancy.

Although the present invention has been described in accordance with the embodiments shown, one of ordinary skill in the art will readily recognize that there could be variations to the embodiments and those variations would be within the spirit and scope of the present invention. For example, although the present invention has been described in terms of a synchronous buck converter, it is suitable in any synchronous converter, and with suitable modification, in any switching converter that requires fault detection to support redundancy, since all converters have clocks and a switching node. Accordingly, many modifications may be made by one of ordinary skill in the art without departing from the spirit and scope of the appended claims.

What is claimed is:

1. A circuit for sensing faults in a redundant power converter, the circuit comprising:

a signal transition monitor for monitoring signal transitions at a predetermined node within the redundant power converter; and a detector for detecting a fault condition in the redundant power converter when a proper signal transition fails to occur during a base period of switching.

2. The circuit of claim 1 wherein the signal transition monitor further comprises a toggle logic flip-flop receiving a signal from the predetermined node as an input signal and a reset signal based on a clock signal as a reset input.

3. The circuit of claim 2 wherein the reset signal further comprises a delayed and inverted clock signal.

4. The circuit of claim 2 wherein the signal transition monitor further comprises a data logic flip-flop coupled at an input to an output of the toggle logic flip-flop and coupled at a clock input to the clock signal.

5. The circuit of claim 4 wherein the detector further comprises a logic device for receiving an output of the data logic flip-flop and a no-clock detection signal and outputting a fault condition signal.

6. The circuit of claim 5 wherein the logic device further comprises an OR gate logic device.

7. The circuit of claim 1 wherein the predetermined node further comprises a summing node of first and second switches and an inductor within the redundant power converter.

8. The circuit of claim 1 wherein the proper signal transition further comprises a rising edge transition in correspondence with a rising edge of a clock signal and a falling edge transition following a falling edge transition in the clock signal.

9. A redundant power converter with fault detection capability, the redundant power converter comprising:

a control unit for utilization in controlling the redundant power converter;

first and second switches coupled at a summing node and to the control unit; and fault detection circuit coupled to the summing node and to the control unit, the fault detection circuit monitoring the summing node for fault detection based on signal transition at the summing node during a predetermined time period.

10. The converter of claim 9 wherein the control unit provides a clock signal, a period of the clock signal establishing a basis for the predetermined time period.

11. The converter of claim 10 wherein the fault detection circuit monitors the summing node to detect whether a rising edge transition occurs with a rising edge of the clock signal and whether a falling edge transition occurs following a falling edge of the clock signal.

12. The converter of claim 11 wherein the fault detection circuit further detects a lack of a clock signal to provide fault detection.

13. The converter of claim 11 wherein a false fault detection is implemented via retries.

14. The converter of claim 9 further comprising an inductor coupled to the first and second switches at the summing node.

15. A method of sensing faults in a redundant power converter, the method comprising the steps of:
 (a) monitoring a predetermined node within the redundant power converter for proper signal transitioning during a base period of switching; and
 (b) detecting a fault condition in the redundant power converter when the proper signal transitioning does not occur during the base period of switching.

16. The method of claim 15 wherein the step (a) of monitoring further comprises (a1) monitoring for a rising edge transition at the predetermined node in correspondence with a rising edge of a clock signal.

17. The method of claim 16 wherein the step (a) of monitoring further comprises (a2) monitoring for a falling edge transition at the predetermined node following a falling edge of the clock signal.

18. The method of claim 15 wherein the predetermined node further comprises a summing node within the redundant power converter for first and second switches and an inductor.

19. The method of claim 15 wherein the step (b) of detecting further comprises (b1) providing fault detection from a no-clock signal condition.

20. The method of claim 19 wherein the step (b) of detecting further comprises (b2) providing false fault detection via retries.

* * * * *